(12) United States Patent  
Maeda

(10) Patent No.: US 9,196,757 B2  
(45) Date of Patent: Nov. 24, 2015

(54) METHOD OF MANUFACTURING SOLAR CELL MODULE AND SOLAR CELL MODULE

(71) Applicant: SANYO Electric Co., Ltd., Osaka (JP)

(72) Inventor: Masanori Maeda, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/571,407

(22) Filed: Dec. 16, 2014

(65) Prior Publication Data

US 2015/0099323 A1 Apr. 9, 2015

Related U.S. Application Data

(63) Continuation of application No. PCT/JP2012/066321, filed on Jun. 27, 2012.

(51) Int. Cl.
*H01L 21/00* (2006.01)
*H01L 31/0203* (2014.01)
*H01L 31/048* (2014.01)

(52) U.S. Cl.
CPC .......... *H01L 31/0203* (2013.01); *H01L 31/048* (2013.01); *Y02E 10/50* (2013.01)

(58) Field of Classification Search
None
See application file for complete search history.

(56) References Cited

FOREIGN PATENT DOCUMENTS

JP 2003-258283 A 9/2003
JP 2011-216804 A 10/2011

*Primary Examiner* — Calvin Choi
(74) *Attorney, Agent, or Firm* — Marvin A. Motsenbocker; Mots Law, PLLC

(57) ABSTRACT

A stack is obtained by stacking a glass plate, a first transparent resin sheet, a solar cell, a second transparent resin sheet, a colored resin sheet, and a first resin sheet. The stack is pressed under heat to fabricate a module including the glass plate, a first transparent bonding layer placed between the glass plate and the solar cell and formed of the first transparent resin sheet, a second transparent bonding layer placed between the first resin sheet and the solar cell and formed of the second transparent resin sheet, a colored bonding layer placed between the second transparent bonding layer and the first resin sheet and formed of the colored resin sheet, and the first resin sheet. A loss modulus of the colored resin sheet at a temperature of the pressing is higher than a loss modulus of the first transparent resin sheet at the temperature of the pressing.

8 Claims, 1 Drawing Sheet

METHOD OF MANUFACTURING SOLAR CELL MODULE AND SOLAR CELL MODULE

CROSS REFERENCE TO RELATED APPLICATIONS

This application is a continuation application of International Application No. PCT/JP2012/066321, filed on Jun. 27, 2012, entitled "METHOD OF MANUFACTURING SOLAR CELL MODULE AND SOLAR CELL MODULE", the entire contents of which are incorporated herein by reference.

TECHNICAL FIELD

The invention relates to a method of manufacturing a solar cell module and a solar cell module.

BACKGROUND ART

There is conventionally known a solar cell module having solar cells provided inside a bonding layer placed between a light-receiving surface member and a back surface member. For example, Japanese Patent Application Publication No. 2003-258283 (Patent Document 1) describes a configuration in which a portion of the bonding layer located between the light-receiving surface member and the solar cells is formed of a transparent ethylene-vinyl acetate copolymer (EVA) film and a portion of the bonding layer located between the back surface member and the solar cells is formed of a colored EVA film. Patent Document 1 states that use of the colored EVA film can improve the output characteristics of the solar cell module.

SUMMARY OF THE INVENTION

The solar cell module described in Patent Document 1 can be manufactured by, for example, thermocompression of a stack in which solar cells are placed between a colored EVA film and a transparent EVA film.

However, when such a manufacturing method is used to manufacture the solar cell module described in Patent Document 1, the colored EVA film may result in being located on the receiving surfaces of the solar cells as well, which lowers the output characteristics of the solar cell module.

A method of manufacturing a solar cell module according to an embodiment obtains a stack by stacking a glass plate, a first transparent resin sheet, a solar cell, a second transparent resin sheet, a colored resin sheet, and a first resin sheet in the order mentioned. The stack is pressed under heat to fabricate the solar cell module including the glass plate, a first transparent bonding layer placed between the glass plate and the solar cell and formed of the first transparent resin sheet, a second transparent bonding layer placed between the first resin sheet and the solar cell and formed of the second transparent resin sheet, a colored bonding layer placed between the second transparent bonding layer and the first resin sheet and formed of the colored resin sheet, and the first resin sheet. A loss modulus of the colored resin sheet at a temperature of the pressing is higher than a loss modulus of the first transparent resin sheet at the temperature of the pressing.

A solar cell module according to an embodiment includes a glass plate, a resin sheet, a bonding layer, and a solar cell. The resin sheet faces the glass plate. The bonding layer is placed between the glass plate and the resin sheet. The solar cell is placed inside the bonding layer. The bonding layer includes a first transparent bonding layer, a second transparent bonding layer, and a colored bonding layer. The first transparent bonding layer is located between the solar cell and the glass plate. The second transparent bonding layer is located between the solar cell and the resin sheet. The colored bonding layer is located between the second transparent bonding layer and the resin sheet. A loss modulus of the colored bonding layer at 125° C. is higher than a loss modulus of the first transparent bonding layer at 125° C.

EMBODIMENTS

Figure 1:
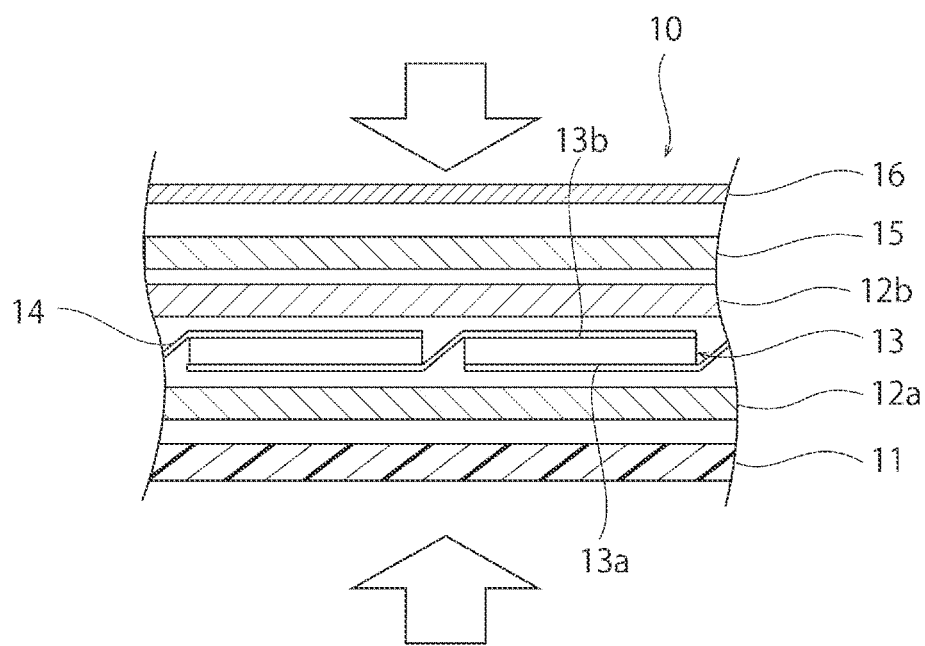
FIG. 1 is a schematic, exploded sectional diagram of a stack according to one embodiment.

Hereinafter, examples of preferred embodiments carrying out the invention are described. It should be noted that the following embodiments are provided just for illustrative purposes. The invention should not be limited at all to the following embodiments.

In the drawings referred to in the embodiments and other parts, components having substantially the same function are referred to with the same reference numeral. In addition, the drawings referred to in the embodiments and other parts are illustrated schematically, and the dimensional ratio and the like of objects depicted in the drawings are different from those of actual objects in some cases. The dimensional ratio and the like of objects are also different among the drawings in some cases. The specific dimensional ratio and the like of objects should be determined with the following description taken into consideration.

(Method of Manufacturing Solar Cell Module 1)

Figure 2:
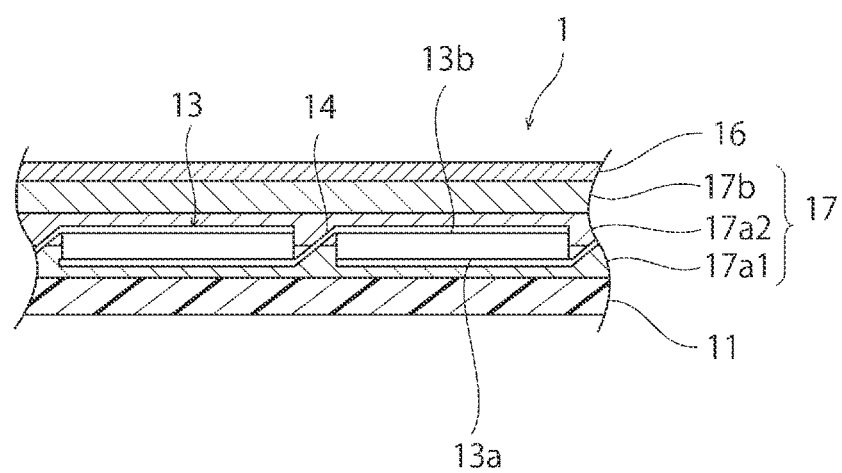
FIG. 2 is a schematic sectional diagram of a solar cell module according to one embodiment.

A method of manufacturing solar cell module 1 illustrated in FIG. 2 is described with reference to FIGS. 1 and 2.

To manufacture solar cell module 1, stack 10 illustrated in FIG. 1 is fabricated first. Specifically, stack 10 is fabricated by stacking glass plate 11, first transparent resin sheet 12a, solar cells 13, second transparent resin sheet 12b, colored resin sheet 15, and resin sheet 16, in the order mentioned.

First transparent resin sheet 12a transmits at least part of light which can contribute to photoelectric conversion in solar cells 13. Preferably, first transparent resin sheet 12a contains substantially no pigment or dye.

Like first transparent resin sheet 12a, second transparent resin sheet 12b also transmits at least part of light which can contribute to photoelectric conversion in solar cells 13. Preferably, second transparent resin sheet 12b contains substantially no pigment or dye.

Colored resin sheet 15 reflects at least part of light, which can contribute to photoelectric conversion in solar cells 13. Preferably, colored resin sheet 15 contains at least one of pigment and dye. For example, colored resin sheet 15 preferably contains titanium-oxide particles. The color tone of colored resin sheet 15 does not necessarily have to be white. The color tone of colored resin sheet 15 may be, for example, black or the like.

For example, between first transparent resin sheet 12a and second transparent resin sheet 12b, single solar cell 13 may be placed, or multiple solar cells 13 electrically connected together by wiring member 14 may be placed.

The type of solar cell 13 is not particularly limited. Solar cell 13 may be, for example, one having a substrate made of crystal semiconductor material. Examples of the substrate made of crystal semiconductor material include a crystal silicon substrate. Solar cell 13 has mainly light-receiving surface 13a and back surface 13b. Solar cell 13 is placed such that light-receiving surface 13a faces the glass plate 11 side and that back surface 13b faces the resin sheet 16 side.

Resin sheet 16 is flexible. Resin sheet 16 can be formed from, for example, a polyethylene terephthalate (PET) resin, a polyvinyl fluoride resin (PVF), a polyvinylidene fluoride (PVDF) resin, or a complex of these. Resin sheet 16 may have a barrier layer made of metal or an inorganic oxide, but is preferably formed of a resin sheet made of substantially only resin.

Next, stack 10 is pressed while being heated (heat pressing step). Thereby, solar cell module 1 illustrated in FIG. 2 is completed. In the heat pressing step, the temperature for heating stack 10 is, for example, about 100° C. to 160° C., or preferably, about 130° C. to 150° C. The temperature for heating stack 10 can be, for example, about 125° C.

Solar cell module 1 has glass plate 11 and resin sheet 16. Resin sheet 16 faces glass plate 11 with a space therebetween. Between resin sheet 16 and glass plate 11, bonding layer 17 is placed, which includes colored resin sheet 15 and first and second transparent resin sheets 12a and 12b. Bonding layer 17 has first transparent bonding layer 17a1 formed of first transparent resin sheet 12a, second transparent bonding layer 17a2 formed of second transparent resin sheet 12b, and colored bonding layer 17b formed of colored resin sheet 15. First transparent bonding layer 17a1 is placed between glass plate 11 and solar cells 13. Second transparent bonding layer 17a2 is placed between resin sheet 16 and solar cells 13. Colored bonding layer 17b is placed between resin sheet 16 and second transparent bonding layer 17a2. Thus, first transparent bonding layer 17a1 is located on a side where light-receiving surfaces 13a of solar cells 13 are provided, and second transparent bonding layer 17a2 and colored bonding layer 17b are located on a side where back surfaces 13b of solar cells 13 are provided. Second transparent bonding layer 17a2 is placed between solar cells 13 and colored bonding layer 17b. Hence, light-receiving surfaces 13a and back surfaces 13b of solar cells 13 are in contact with the respective transparent bonding layers.

When a stack having a solar cell located between a transparent resin sheet and a colored resin sheet is pressed under heat, the colored resin may result in being located on the light-receiving surface of the solar cell, as well. In such a case, the colored resin located on the light-receiving surface reflects or absorbs light trying to enter the solar cell. This lowers the amount of light entering the solar cell, and consequently lowers the output characteristics of the solar cell module.

As a result of intense study, the inventors have found that the colored resin results in being located on the light-receiving surface due to the following two causes (1) and (2).

(1) Part of the colored resin sheet goes around to light-receiving surface 13a.

(2) The colored resin sheet melted and the transparent resin sheet melted are mixed together on the light-receiving surface.

Among these causes (1) and (2), when (2) occurs, i.e., when the melted colored resin sheet and the melted transparent resin sheet are mixed together, the colored resin tends to occupy a large portion of the light-receiving surface. Hence, from the perspective of improving the output characteristics, it is important to suppress the mixing of the melted colored resin sheet and the melted transparent resin sheet.

Thus, in this embodiment, second transparent resin sheet 12b is provided between solar cells 13 and colored resin sheet 15. In addition, the loss modulus of colored resin sheet 15 at the temperature of pressing stack 10 is higher than the loss modulus of first transparent resin sheet 12a at the temperature of pressing stack 10. Such a high loss modulus of colored resin sheet 15 at the pressing temperature makes it hard for colored resin sheet 15 to be mixed with transparent resin sheets 12a, 12b while stack 10 is pressed. This suppresses the following: the colored resin contained in colored resin sheet 15 and the transparent resin contained in transparent resin sheets 12a, 12b are mixed with each other to form a mixed resin and are located on light-receiving surface 13a. As a result, solar cell module 1 with improved output characteristics can be obtained. By thus making the loss modulus of colored bonding layer 17b at 125° C. higher than the loss modulus of first transparent bonding layer 17a1 at 125° C., the output characteristics of solar cell module 1 can be improved.

For example, even with the second transparent resin sheet being interposed between the solar cells and the colored resin sheet, if the loss modulus of the colored resin sheet at the pressing temperature is low, the colored resin sheet may be mixed with the first and second transparent resin sheets, consequently lowering the output characteristics.

From the perspective of improving the output characteristics more, the loss modulus of colored resin sheet 15 at the pressing temperature is preferably three times or more, or more preferably, four times or more the loss modulus of first transparent resin sheet 12a at the pressing temperature. The loss modulus of colored bonding layer 17b at 125° C. is preferably four times or more, or more preferably, five times or more the loss modulus of first transparent bonding layer 17a1 at 125° C. However, if the loss modulus of colored resin sheet 15 at the pressing temperature is too high, the colored resin sheet might go around to the light-receiving surface. For this reason, the loss modulus of colored resin sheet 15 at the pressing temperature is preferably 20 times or less, or more preferably, five times or less the loss modulus of first transparent resin sheet 12a at the pressing temperature. The loss modulus of colored bonding layer 17b at 125° C. is preferably 13 times or less, or more preferably, five times or less the loss modulus of first transparent bonding layer 17a1 at 125° C. Specifically, the loss modulus of colored resin sheet 15 at the pressing temperature is 300,000 Pa or higher preferably, 400,000 Pa or higher more preferably, or 500,000 Pa or higher even more preferably. The loss modulus of colored bonding layer 17b at 125° C. is 300,000 Pa or higher preferably, 400,000 Pa or higher more preferably, or 500,000 Pa or higher even more preferably. The loss modulus of colored resin sheet 15 at the pressing temperature is preferably 1,000,000 Pa or less, or more preferably, 800,000 Pa or less. The loss modulus of colored bonding layer 17b at 125° C. is preferably 800,000 Pa or less, or more preferably, 700,000 Pa or less. The loss modulus of first transparent resin sheet 12a at the pressing temperature is preferably 200,000 Pa or less, or more preferably, 150,000 Pa or less. The loss modulus of first transparent bonding layer 17a1 at 125° C. is preferably 200,000 Pa or less, or more preferably, 150,000 Pa or less. However, if the loss modulus of first transparent resin sheet 12a at the pressing temperature is too low, too much resin might flow out, making the film thickness small. For this reason, the loss modulus of first transparent resin sheet 12a at the pressing temperature is preferably 100,000 Pa or higher, or more preferably, 150,000 Pa or higher. The loss modulus of first transparent bonding layer 17a1 at 125° C. is preferably 100,000 Pa or higher, or more preferably, 150,000 Pa or higher.

The loss modulus of second transparent resin sheet 12b at the pressing temperature is not particularly limited. This is because the colored resin does not result in being located on light-receiving surface 13a even if second transparent resin sheet 12*b* has a low loss modulus at the pressing temperature and is mixed with melted first transparent resin sheet 12*a* when melted.

If resin sheet 16 does not have a barrier layer and is formed of a resin sheet made of substantially only resin, the coefficient of thermal expansion of resin sheet 16 is higher than that in a case a barrier layer is provided. However, since the loss modulus of colored resin sheet 15 at the pressing temperature and the loss modulus of colored bonding layer 17*b* at 125° C. are high, deformation of colored resin sheet 15 due to the extension and contraction of resin sheet 16 is suppressed. Thus, application of stress to solar cell 13 can be suppressed.

The examples described below use non-crosslinked polyolefin for the resin with a loss modulus of 300,000 Pa or higher at 125° C. and crosslinked polyolefin for the resin with a loss modulus of 200,000 Pa or less at 125° C.

The loss modulus can be measured by, for example, DMA (Dynamic Mechanical Analysis) measurement.

EXAMPLE 1

A stack is obtained by stacking, in the order mentioned, a glass plate with a thickness of 3.2 mm, a first transparent resin sheet made of crosslinked polyolefin and having a thickness of 0.6 mm (the loss modulus at 125° C.=150,000 Pa), a solar cell, a second transparent resin sheet made of non-crosslinked polyolefin and having a thickness of 0.15 mm (the loss modulus at 125° C.=700,000 Pa), a colored resin sheet made of non-crosslinked polyolefin and having a thickness of 0.30 mm (the loss modulus at 125° C.=700,000 Pa), and a resin sheet made of PET and having a thickness of 0.13 mm. Then, the stack is pressed while being heated to a temperature of 150° C.

EXAMPLE 2

A solar cell module is fabricated in a similar manner to Example 1, except for using a resin sheet made of polyolefin and having a thickness of 0.35 mm (the loss modulus at 125° C.=700,000 Pa) as the colored resin sheet and using a resin sheet made of crosslinked polyolefin and having a thickness of 0.6 mm (the loss modulus at 125° C.=150,000 Pa) as the first

EXAMPLE 3

A solar cell module is fabricated in a similar manner to Example 1, except for using a resin sheet made of polyolefin and having a thickness of 0.40 mm (the loss modulus at 125° C.=700,000 Pa) as the colored resin sheet and using a resin sheet made of crosslinked polyolefin and having a thickness of 0.6 mm (the loss modulus at 125° C.=150,000 Pa) as the first transparent resin sheet.

COMPARATIVE EXAMPLE 1

A solar cell module is fabricated in a similar manner to Example 1, except for using a resin sheet made of ethylene-vinyl acetate copolymer and having a thickness of 0.6 mm (the loss modulus at 125° C.=200,000 Pa) as the colored resin sheet and using a resin sheet made of crosslinked polyolefin and having a thickness of 0.6 mm (the loss modulus at 125° C.=150,000 Pa) as the first transparent resin sheet.

COMPARATIVE EXAMSPLE 2

A solar cell module is fabricated in a similar manner to Example 1, except for using a resin sheet made of crosslinked polyolefin and having a thickness of 0.6 mm (the loss modulus at 125° C.=200,000 Pa) as the colored resin sheet and using a resin sheet made of crosslinked polyolefin and having a thickness of 0.6 mm (the loss modulus at 125° C.=150,000 Pa) as the first transparent resin sheet.

(Evaluation)

The solar cell modules fabricated in Examples 1 to 3 and Comparative Examples 1 and 2 are observed from the glass plate side to check whether there is colored resin present on the light-receiving surface. As a result, in Examples 1 to 3, substantially no colored resin is present on the light-receiving surface. In Comparative Examples 1 to 3, colored resin is present along the entire peripheral edge portion of the light-receiving surface.

In this way, the embodiments above provide methods of manufacturing solar cell modules and solar cell modules that has improved output characteristics.

The invention includes other embodiments in addition to the above-described embodiments without departing from the spirit of the invention. The embodiments are to be considered in all respects as illustrative, and not restrictive. The scope of the invention is indicated by the appended claims rather than by the foregoing description. Hence, all configurations including the meaning and range within equivalent arrangements of the claims are intended to be embraced in the invention.

The invention claimed is:

1. A method of manufacturing a solar cell module, the method comprising:
   obtaining a stack by stacking a glass plate, a first transparent resin sheet, a solar cell, a second transparent resin sheet, a colored resin sheet, and a first resin sheet in the order mentioned; and
   pressing the stack under heat to fabricate the solar cell module including
      the glass plate,
      a first transparent bonding layer placed between the glass plate and the solar cell and formed of the first transparent resin sheet,
      a second transparent bonding layer placed between the first resin sheet and the solar cell and formed of the second transparent resin sheet,
      a colored bonding layer placed between the second transparent bonding layer and the first resin sheet and formed of the colored resin sheet, and
      the first resin sheet, wherein
   a loss modulus of the colored resin sheet at a temperature of the pressing is higher than a loss modulus of the first transparent resin sheet at the temperature of the pressing, and wherein
   the loss modulus of the colored bonding layer at 125 degrees C. is three times or more the loss modulus of the first transparent bonding layer at 125 degrees C.

2. The method of manufacturing a solar cell module according to claim 1, wherein
   the loss modulus of the colored resin sheet at the temperature of the pressing is four times or more the loss modulus of the first transparent resin sheet at the temperature of the pressing.

3. The method of manufacturing a solar cell module according to claim 1, wherein
   the loss modulus of the colored resin sheet at the temperature of the pressing is 300,000 Pa or higher.

4. The method of manufacturing a solar cell module according to claim 1, wherein
   the loss modulus of the first transparent resin sheet at the temperature of the pressing is 200,000 Pa or less.

5. The method of manufacturing a solar cell module according to claim 1, wherein
a loss modulus of the second transparent resin sheet at the temperature of the pressing is higher than the loss modulus of the first transparent resin sheet at the temperature of the pressing.

6. The method of manufacturing a solar cell module according to claim 5, wherein
the loss modulus of the second transparent resin sheet at the temperature of the pressing is 300,000 Pa or higher.

7. The method of manufacturing a solar cell module according to claim 1, wherein
the first resin sheet is made of resin.

8. The method of manufacturing a solar cell module according to claim 1, wherein the temperature of the pressing is 100 degrees to 160 degrees C.

* * * * *